US008871650B2

(12) United States Patent
Nemani et al.

(10) Patent No.: US 8,871,650 B2
(45) Date of Patent: Oct. 28, 2014

(54) POST ETCH TREATMENT (PET) OF A LOW-K DIELECTRIC FILM

(71) Applicants: Srinivas D. Nemani, Sunnyvale, CA (US); Nicolas J. Bright, Malibu, CA (US); Thorsten B. Lill, Santa Clara, CA (US); Yifeng Zhou, Fremont, CA (US); Jamie Saephan, Alameda, CA (US); Ellie Yieh, San Jose, CA (US)

(72) Inventors: Srinivas D. Nemani, Sunnyvale, CA (US); Nicolas J. Bright, Malibu, CA (US); Thorsten B. Lill, Santa Clara, CA (US); Yifeng Zhou, Fremont, CA (US); Jamie Saephan, Alameda, CA (US); Ellie Yieh, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 13 days.

(21) Appl. No.: 13/646,113

(22) Filed: Oct. 5, 2012

(65) Prior Publication Data

US 2013/0109187 A1 May 2, 2013

Related U.S. Application Data

(60) Provisional application No. 61/552,942, filed on Oct. 28, 2011.

(51) Int. Cl.
*H01L 21/302* (2006.01)
*H01L 21/3105* (2006.01)
*H01L 21/768* (2006.01)
*H01L 21/311* (2006.01)
*H01L 21/02* (2006.01)

(52) U.S. Cl.
CPC ... *H01L 21/76814* (2013.01); *H01L 2221/1063* (2013.01); *H01L 21/3105* (2013.01); *H01L 21/76826* (2013.01); *H01L 21/02126* (2013.01); *H01L 21/31144* (2013.01); *H01L 21/02063* (2013.01)
USPC ............... 438/710; 438/689; 216/37; 216/67

(58) Field of Classification Search
USPC .............................. 216/37, 67; 438/689, 710
See application file for complete search history.

(56) References Cited

U.S. PATENT DOCUMENTS

| 6,159,842 | A  | * | 12/2000 | Chang et al. ............... 438/622 |
| 7,192,531 | B1 | * | 3/2007  | Kang et al. ................ 216/37 |
| 7,442,649 | B2 | * | 10/2008 | Kim et al. ................. 438/710 |
| 8,034,638 | B1 | * | 10/2011 | Schravendijk et al. ....... 438/4 |
| 8,314,033 | B2 | * | 11/2012 | Zhou et al. ................. 438/707 |

* cited by examiner

*Primary Examiner* — Nadine Norton
*Assistant Examiner* — Maki Angadi
(74) *Attorney, Agent, or Firm* — Blakely Sokoloff Taylor Zafman LLP

(57) ABSTRACT

Post etch treatments (PETs) of low-k dielectric films are described. For example, a method of patterning a low-k dielectric film includes etching a low-k dielectric layer disposed above a substrate with a first plasma process. The etching involves forming a fluorocarbon polymer on the low-k dielectric layer. The low-k dielectric layer is surface-conditioned with a second plasma process. The surface-conditioning removes the fluorocarbon polymer and forms an Si—O-containing protecting layer on the low-k dielectric layer. The Si—O-containing protecting layer is removed with a third plasma process.

13 Claims, 8 Drawing Sheets

OXIDIZING ASH

~40% in SiCOH with k= 2.5

~10% in SiCOH with k= 2.5

REDUCING ASH

US 8,871,650 B2

POST ETCH TREATMENT (PET) OF A LOW-K DIELECTRIC FILM

CROSS-REFERENCE TO RELATED APPLICATIONS

This application claims the benefit of U.S. Provisional Application No. 61/552,942, filed Oct. 28, 2011, the entire contents of which are hereby incorporated by reference herein.

BACKGROUND

1) Field

Embodiments of the present invention pertain to the field of semiconductor processing and, in particular, to post etch treatments (PETs) of low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

Embodiments of the present invention include post etch treatments (PETs) of low-k dielectric films.

In an embodiment, a method of patterning a low-k dielectric film includes etching a low-k dielectric layer disposed above a substrate with a first plasma process. The etching involves forming a fluorocarbon polymer on the low-k dielectric layer. The low-k dielectric layer is surface-conditioned with a second plasma process. The surface-conditioning removes the fluorocarbon polymer and forms an Si—O-containing protecting layer on the low-k dielectric layer. The Si—O-containing protecting layer is removed with a third plasma process.

In another embodiment, a system for patterning a low-k dielectric film includes a mainframe. An etch chamber is housed in the mainframe, the etch chamber for etching a low-k dielectric layer. A post etch treatment (PET) chamber is also housed in the mainframe, the PET chamber for dry cleaning the low-k dielectric layer.

In another embodiment, a method of patterning a low-k dielectric film includes etching a trench in a low-k dielectric layer with a first plasma process. The low-k dielectric layer is disposed above a substrate. The etching involves forming a fluorocarbon polymer on the low-k dielectric layer in the trench. The low-k dielectric layer is surface-conditioned with a second plasma process. The surface-conditioning removes the fluorocarbon polymer from the trench and forms an Si—O-containing protecting layer on the low-k dielectric layer in the trench. The Si—O-containing protecting layer is removed with a third plasma process. Then, without exposing the low-k dielectric layer to a wet clean process, a metal layer is formed in the trench.

DETAILED DESCRIPTION

Post etch treatments (PETs) of low-k dielectric films are described. In the following description, numerous specific details are set forth, such as specific plasma treatments, in order to provide a thorough understanding of embodiments of the present invention. It will be apparent to one skilled in the art that embodiments of the present invention may be practiced without these specific details. In other instances, well-known aspects, such as photolithography-based patterning for mask formation, are not described in detail in order to not unnecessarily obscure embodiments of the present invention. Furthermore, it is to be understood that the various embodiments shown in the Figures are illustrative representations and are not necessarily drawn to scale.

Porous low-k dielectric materials, e.g. porous SiCOH, are typically sensitive to plasma etching. Issues typically arise surrounding damage caused to an Si—$CH_3$ network in an ultra-low-k (ULK) film during an etch process. Such damage may impact the mechanical integrity of a ULK film. The sensitivity may also arise from a high porosity which allows etching chemistry to diffuse deep into low-k dielectric film. Furthermore, there may be an "F memory effect" resulting from polymer formed during a fluorocarbon-based ($C_xF_y$-based) etch process. Exacerbating the situation, techniques of removing the polymer formed during a fluorocarbon-based etch process, e.g., removal by ashing, may add to the detrimental impact to an underlying low-k material in an overall patterning process.

Figure 1:
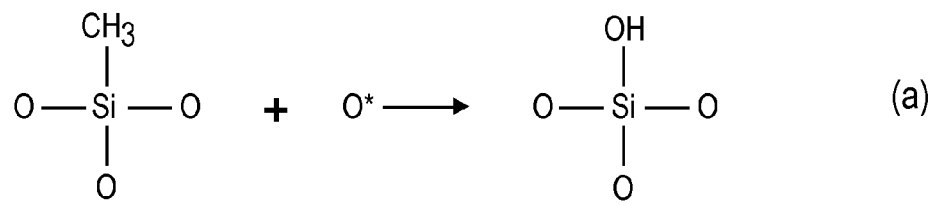
FIG. 1 illustrates mechanisms through which a low-k dielectric layer may be damages or impacted under conventional oxidizing plasma conditions used to remove polymer formed in a conventions fluorocarbon-based etching process.
Figure 1:
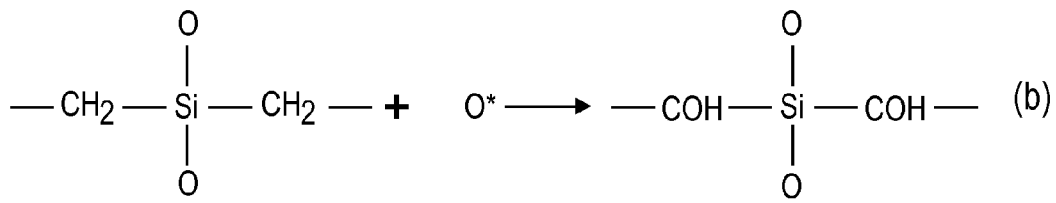
Figure 1:
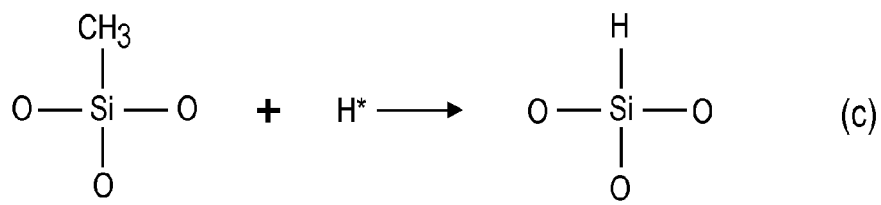

FIG. 1 illustrates mechanisms through which a low-k dielectric layer may be damaged or impacted under conventional oxidizing plasma conditions used to remove polymer formed in a conventional fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an SiO$_3$-methyl fragment, which makes up approximately 40% of a SiCOH low-k film with a dielectric constant of about 2.5, can undesirably lose its methyl group to a hydride ligand (H).

In addition to the above described ashing damage in processes used to remove polymer formed during a fluorocarbon-based etch process from a low-k dielectric material, post etch treatments (PETs) such as wet cleaning or wet etching are typically used, e.g., to remove residual particles remaining after an ash process. Standard practice usually includes wet cleaning with dilute hydrofluoric acid (HF) post etching and ashing. However, wet clean processes, particularly aqueous-based processes, may further degrade the quality of the low-k material, e.g., by raising the effective dielectric constant through moisture absorption into the low-k film. Furthermore, a wet clean PET may also lead to undesirable line bending and defect formation which may drastically impact integration performance.

Etch processing sequences for reducing damage and forming stable surfaces for low-k dielectric films are provided herein. Specifically, one or more embodiments of the present inventions are directed to low-k dielectric film etching technology. One or more embodiments address the damage caused to the low-k dielectric films (e.g., films based on a C-doped oxide material) during conventional etching. In an embodiment, a sequence of a modified post etch treatment in an etch chamber is followed by Siconi etch process to eliminate residue from the treatment operation. In one such embodiment, an additional chemical treatment post the Siconi operation is used to form a hydrophobic surface and may be added to the PET process to improve film stability.

One or more advantages of embodiments disclosed herein may include, but are not limited to, prevention of low-k film damage with wet chemicals (e.g., undercut), avoidance of dielectric flopover caused by wet chemistry, prevention of moisture penetration into a low-k film, effective removal of etch polymer residue from all surfaces. In an embodiment, one or more PET processes described herein are referred to as "dry" clean processes since no wet chemical (particularly aqueous based chemicals) are used in the PET. In one such embodiment, dry cleaning removal of C-based etch polymer is achieved through such a process sequence. In one embodiment, a need for wet etch processing is eliminated by eliminating residue in the plasma etch mainframe.

In a particular embodiment, ultra low-K (ULk) processing includes use of a dry clean approach by optimizing a PET to form SiOx-based residue on the ULk surface. A Siconi etch is then used to eliminate the residue. The ULk surface may be sealed (e.g., by silylation used to replace methyl groups) without air exposure. In one such embodiment, SiF$_4$ and SiCl$_4$ addition to an ash process forms SiOx residue and reduces ULk damage (in situ). Thus, the process may control the nature of the residue is formed.

In light of the above, one or more embodiments herein is used not only for protected CF removal, as above, but also to eliminate wet etch. Benefits of eliminating wet etch may include elimination of moisture damage and k increase. Additionally, silylation may be performed for low-k repair. Thus, one or more embodiments address one or more of the following three conventional impacts on k value: (1) protection during CF removal in an oxidizing plasma (limit k increase), (2) removal of wet cleans operations (conventional absorption of water and increase of k), or (3) silylation as a k repair (lower k value once repaired).

Figure 2:
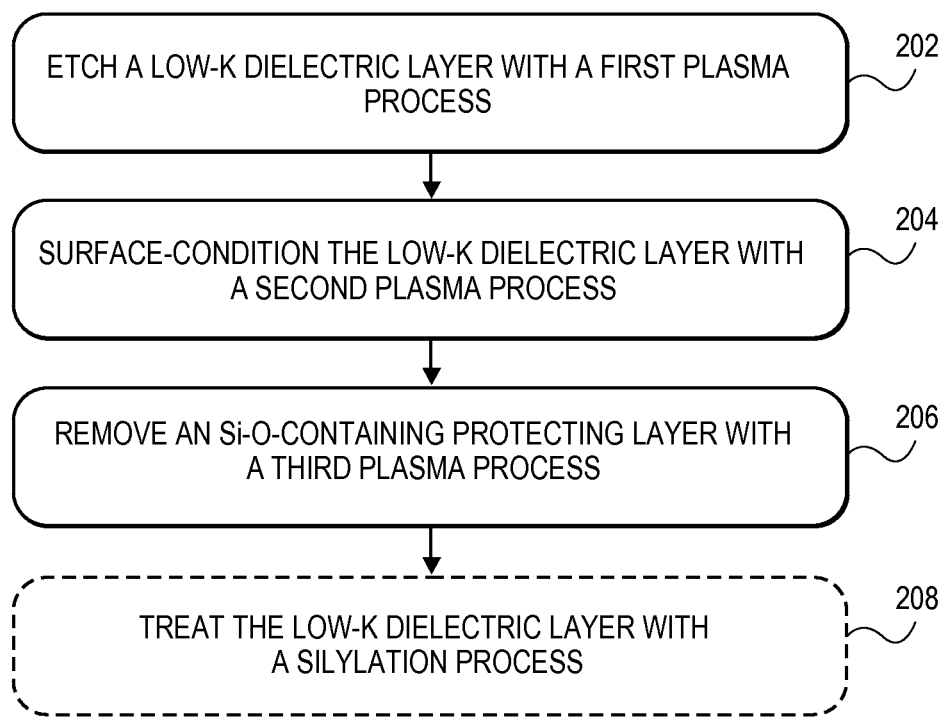
FIG. 2 is a Flowchart representing operations in a method of patterning a low-k dielectric film, in accordance with an embodiment of the present invention.

In an aspect of the present invention, a low-k dielectric film is patterned with an etch process followed by a "dry" post etch treatment (PET). For example, FIG. 2 is a Flowchart 200 representing operations in a method of patterning a low-k dielectric film, in accordance with an embodiment of the present invention. FIGS. 3A-3F illustrate cross-sectional views representing operations in a method of patterning a low-k dielectric film, in accordance with an embodiment of the present invention.

Figure 3A:
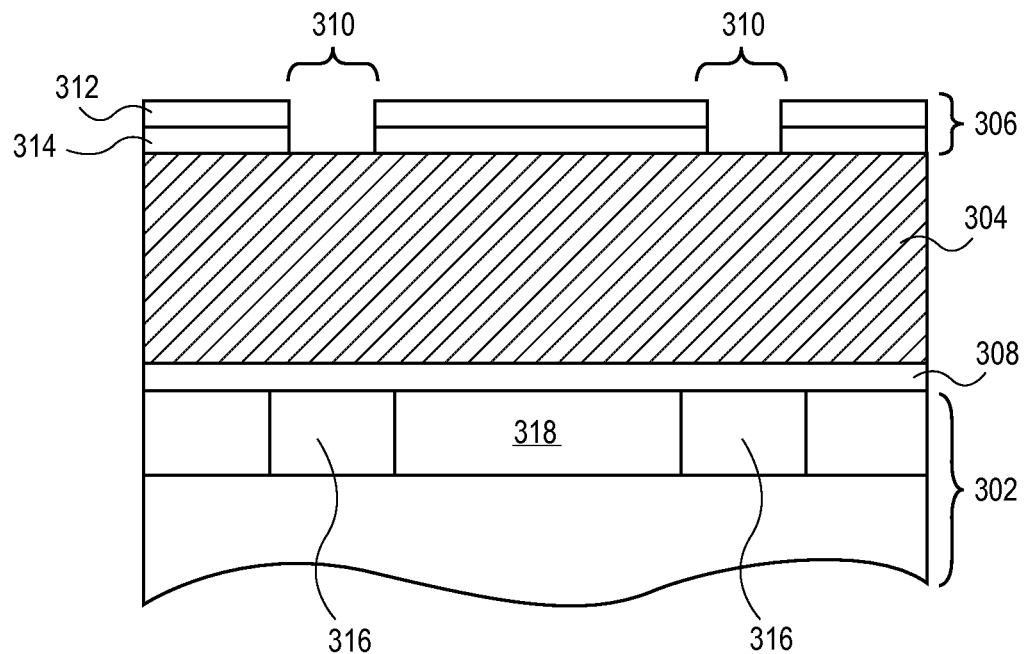
FIGS. 3A-3F illustrate cross-sectional views representing various operations in a method of patterning a low-k dielectric film, corresponding to the Flowchart of FIG. 2, in accordance with an embodiment of the present invention.

Referring to FIG. 3A, a patterned mask stack 306 is formed above a low-k dielectric layer 304 disposed above a substrate 302. An etch stop layer 308, such as a Blok layer, may be disposed between the low-k dielectric layer 304 and the substrate 302, as depicted in FIG. 3A.

In an embodiment, the patterned mask stack 306 is formed to have a first pattern 310, e.g., for forming a via or a plurality of vias. In an embodiment, the patterned mask stack 306 is formed to have the first pattern 310 by first forming and patterning a photoresist layer above blanket layers of the mask stack 306 with, in a specific embodiment, an intervening dielectric layer (although not shown). In one embodiment, forming and patterning a photoresist layer above the blanket layers of the mask stack 306 includes using a photoresist layer composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

In an embodiment, the mask stack 306 includes a first hardmask layer 312, such as a metal-containing hardmask layer, e.g., titanium nitride (TiN) or tantalum nitride (TaN) which is disposed above a second hardmask layer 314 disposed on the low-k dielectric layer 304. In one such embodiment, the second hardmask layer 314 is an oxide hardmask layer such as a layer of silicon oxide or silicon oxynitride. In another embodiment, however, the second hardmask layer 314 is a layer of non-oxide dielectric material such as, but not limited to, a layer of silicon nitride.

In an embodiment, the low-k dielectric layer 304 has a permittivity less than that of silicon dioxide, e.g., less than approximately 3.9. In one embodiment, the low-k dielectric layer 304 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 304 is a porous SiCOH layer having a dielectric constant of less than 2.7.

Substrate 402 may generally refer to a semiconductor substrate or, more specifically, to layers formed on such a substrate. For example, the process described in association with FIGS. 3A-3F may take place sometime during the back end of line (BEOL) patterning of interconnect layers. In one such embodiment, substrate 302 actually represents a layer of metal lines 316 in a dielectric layer 318, or of an array of contacts between back end layers and front end layers, such as device layers. Regardless of which layers may specifically reside in what is labeled herein as substrate 302, the stack of layers may ultimately, in an embodiment, reside on a material suitable to withstand a fabrication process. In an embodiment, a plurality of semiconductor devices resides somewhere below low-k dielectric layer 304.

Figure 3B:
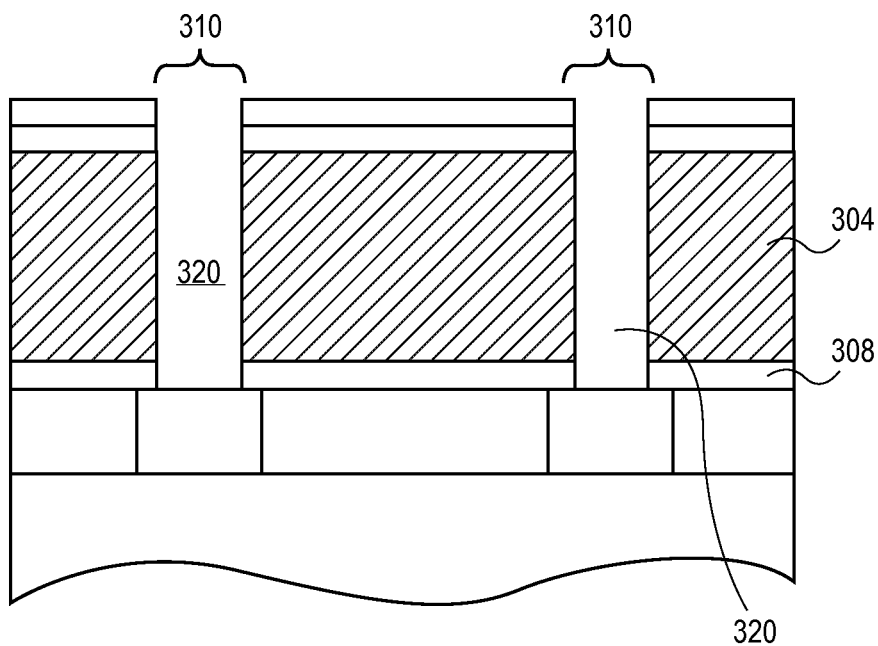

Referring to FIG. 3B, the first pattern 310 of the mask stack 306 is transferred into the low-k dielectric layer 304 and, possibly, into and through the etch stop layer 308. In an embodiment, the first pattern 310 is intended as a via pattern and, so, the patterning of the low-k dielectric layer 304 at this stage is a via 320 etch. In an embodiment, one or both of the low-k dielectric layer 304 and the etch stop layer 308 are patterned by plasma etch processes, such as the "first" plasma etch process described below in association with FIG. 3C.

Figure 3C:
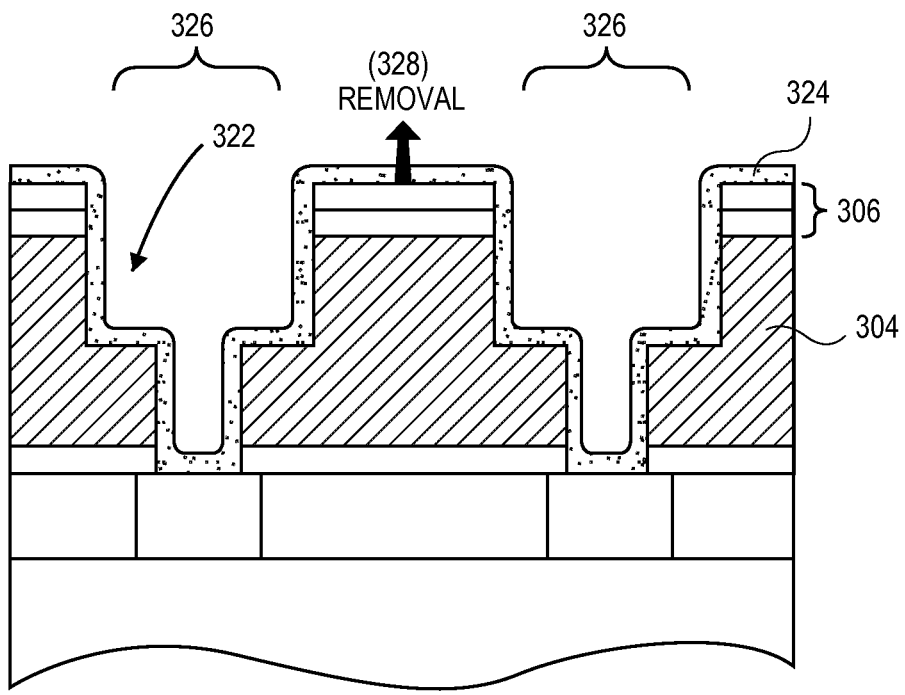

Referring to operation 202 of Flowchart 200, and to corresponding FIG. 3C, one or more trenches 322 are etched in the low-k dielectric layer 304 with a plasma process. In an embodiment, the plasma process uses a plasma generated from a $C_xF_y$-based gas. In one such embodiment, the etching process leads to formation of a fluorocarbon polymer 324 on the low-k dielectric layer 304, including in the trench 322. The trench 322 may be formed from a second pattern 326 formed in the mask stack 306, and may be used to form a trench portion of a dual damascene structure which include the originally formed vias 320. The etch used to form trenches 322 may be the same etch used in one or more process operations used to form vias 312. However, for the sake of clarity in describing one or more embodiments of the present invention, the etch process used to form trenches 322 is referred to herein as the first plasma process.

Figure 3D:
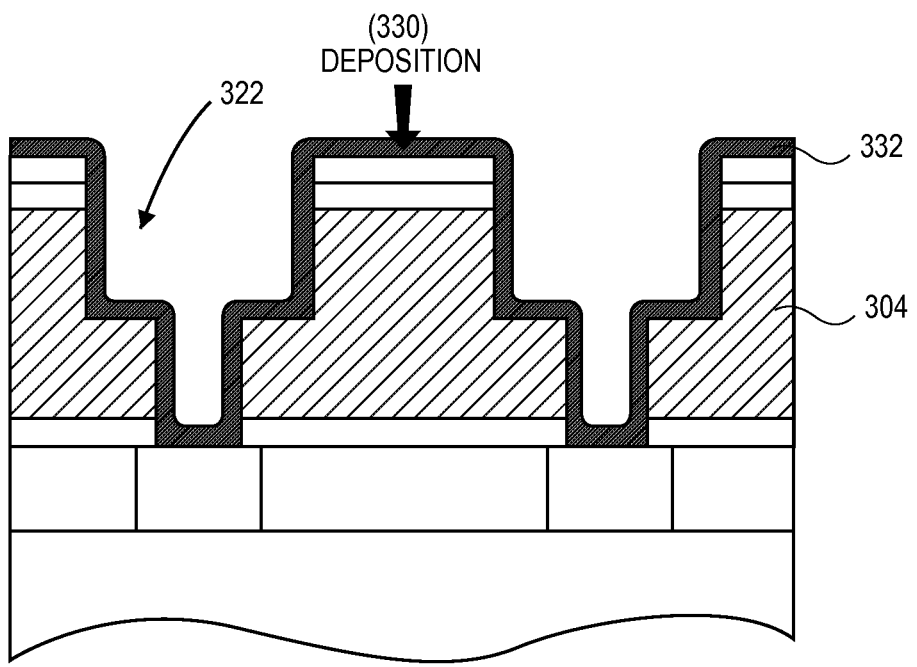

Referring to operation 204 of Flowchart 200, and to corresponding FIG. 3D, the low-k dielectric layer 304 is surface-conditioned with a "second" plasma process. In an embodiment, the second plasma process is used to remove the fluorocarbon polymer 324 from the trench 322 and to form an Si—O-containing protecting layer 332 on the low-k dielectric layer 304, including in the trench 322. As such, referring to both FIGS. 3C and 3D, the surface-conditioning process includes both the removal 328 of the fluorocarbon polymer 324 and the deposition 330 of the Si—O-containing protecting layer 332. Although depicted sequentially in moving from FIGS. 3C to 3D, in an embodiment, at least a portion of each of the removal 328 of the fluorocarbon polymer 324 and the deposition 330 of the Si—O-containing protecting layer 332 overlaps. That is, as the fluorocarbon polymer 324 is removed to expose portions of the low-k dielectric layer 304, the Si—O-containing protecting layer 332 starts to form on those exposed portions. This interaction may not occur at all locations at the same time.

In an embodiment, surface-conditioning the low-k dielectric layer 304 with the second plasma process includes using a plasma derived from an oxygen radical source and a silicon source. In one such embodiment, the plasma process deposits a silicon oxide (e.g., either stoichiometric silicon dioxide or some suboxide). In a specific such embodiment, the oxygen radical source is a molecule with a dissociation product including an oxygen radical, the oxygen radical source one such as, but not limited to, oxygen ($O_2$), ozone ($O_3$), carbon dioxide ($CO_2$), or water ($H_2O$). In another specific such embodiment, which may be combined with the above embodiment, the silicon source is a molecule that reacts with an oxygen radical to form a silicon oxide layer on the low-k dielectric layer, the silicon source one such as, but not limited to, silicon tetrafluoride ($SiF_4$), silicon tetrachloride ($SiC_{14}$), silane ($SiH_4$), dimethylsilane (($CH_3)_2SiH_2$), trimethylsilane (($CH_3)_3SiH$), or N-(Trimethylsilyl)dimethylamine (($CH_3)_3SiN(CH_2)_2$).

Thus, in an embodiment, the surface conditioning involves use of an ashing chemistry that includes both an oxygen (O) radical source and a silicon (Si) source. When both the O radical source and the Si source are present in an ashing plasma, the ashing plasma removes fluorocarbon polymer 324 and, in the same process, deposits silicon oxide (e.g., $SiO_x$) on the low-k dielectric film 304. The $SiO_x$ layer may reduce exposure of the low-k dielectric film 304 to the ashing plasma and reduce ashing damage. Overall, then, a first operation of a drycleaning process for a low-k dielectric film may include surface conditioning, such as performing a treatment post trench etch to eliminate CF polymer and protect the ULK film. For example, a Si-based precursor addition to an oxidizing environment may work to effectively eliminate C-based residue and deposit a few layers of SiOx to seal the ULK surface.

Figure 3E:
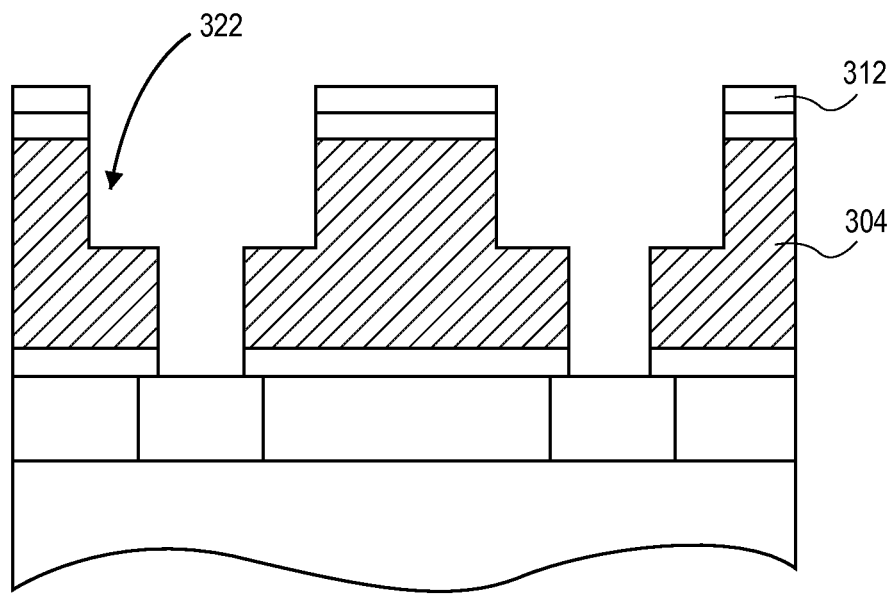

Referring to operation 206 of Flowchart 200 and corresponding FIG. 3E, the Si—O-containing protecting layer 332 is removed with a third plasma process to re-expose trenches 322 and, hence, low-k dielectric layer 304. In an embodiment, the removal is selective to the low-k dielectric layer 304. In an embodiment, removing the Si—O-containing protecting layer 332 from the low-k dielectric layer 304 includes exposing the low-k dielectric layer 304 to a plasma process based on a plasma generated from a gas such as, but not limited to, $NF_3$, ammonia ($NH_3$), or a combination thereof. For example, in a specific such embodiment, a "Siconi" dry etch is used and involves (a) etchant generation in the plasma according to $NF_3+NH_3 \rightarrow NH_4F+NH_4F \cdot HF$, (b) etch process at approximately 30 degrees Celsius according to $NH_4F$ or $NH_4F \cdot HF + SiO_2 \rightarrow (NH_4)_2SiF_6$ (solid)+$H_2O$, and (c) sublimation above approximately 100 degrees Celsius according to $(NH_4)_2SiF_6$ (solid)$\rightarrow SiF_4$ (gas)+($NH_3$) (gas)+HF (gas). In an alternative embodiment, however, removing the Si—O-containing protecting layer 332 includes exposing the low-k dielectric layer 304 to a vapor such as, but not limited to, hydrogen fluoride (HF) vapor or $NF_4.HF$ vapor. Overall, then, a next operation of a drycleaning process for a low-k dielectric film may include a Siconi clean, such as a siconi etch to eliminate the SiOx layer and provide a pristine ULK surface.

Figure 3F:
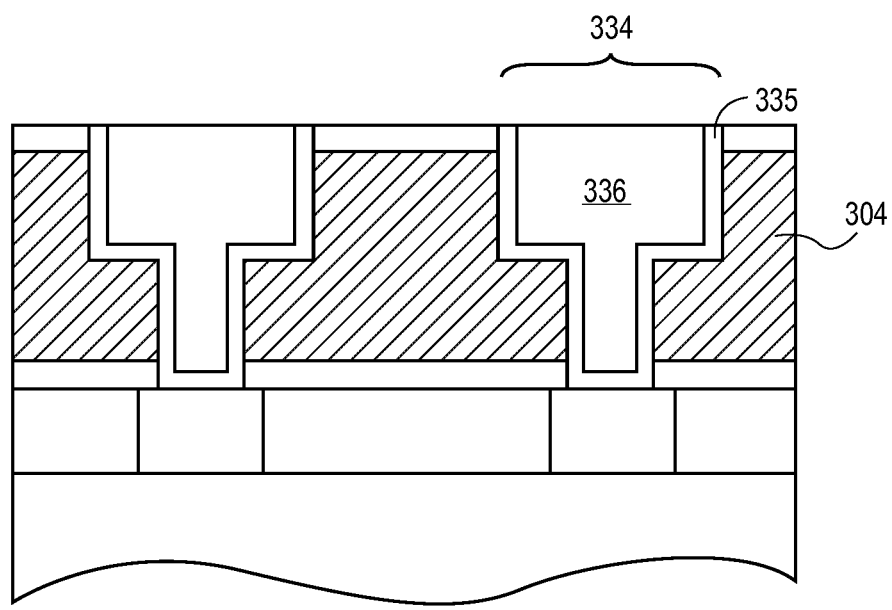

Referring to FIG. 3F, in an embodiment, a metal structure 334 is formed in the trenches 322 of the low-k dielectric layer 304. In one such embodiment, the metal structure 334 includes a metal layer 335 and a fill metal 336, as depicted in FIG. 3F. In one embodiment, upon completion of the formation of the metal structure 334, which may involve a chemical mechanical polishing operation, one or more layers of the mask stack (such as layer 312) is removed, as is also depicted in FIG. 3F. In an embodiment, the metal structure 334 is formed in the low-k dielectric layer 304 without an intervening exposing of the low-k dielectric layer 304 to a wet clean process subsequent to the removal of the Si—O-containing protecting layer 332.

In accordance with an embodiment of the present invention, subsequent to removing the Si—O-containing protecting layer 332 and prior to forming the metal structure 334, the low-k dielectric layer 304 is treated with a silylation process. In one such embodiment, the above process is performed without performing an intervening exposing of the low-k dielectric layer 304 to a pre-bake process. In an embodiment, the silylation process includes treating the low-k dielectric layer 304 with a silicon-containing species such as, but not limited to, hexamethyldisilazane (HMDS) or SilylQ. In one embodiment, treating the low-k dielectric layer 304 with the silylation process lowers the effective k-value of the low-k dielectric layer 304 relative to the effective k-value of the low-k dielectric layer 304 following the third plasma process. In an embodiment, both the removal of the Si—O-containing protecting layer and the silylation process are performed in the same process chamber. Overall, then, a next operation of a drycleaning process for a low-k dielectric film may include silylation to as a hydrophobic surface treatment of the low-k dielectric film by exposure to silylating chemistry, e.g., within a siconi chamber. The silylation treatment may prevent or inhibit moisture uptake and eliminate the need for an extra baking step.

Figure 4:
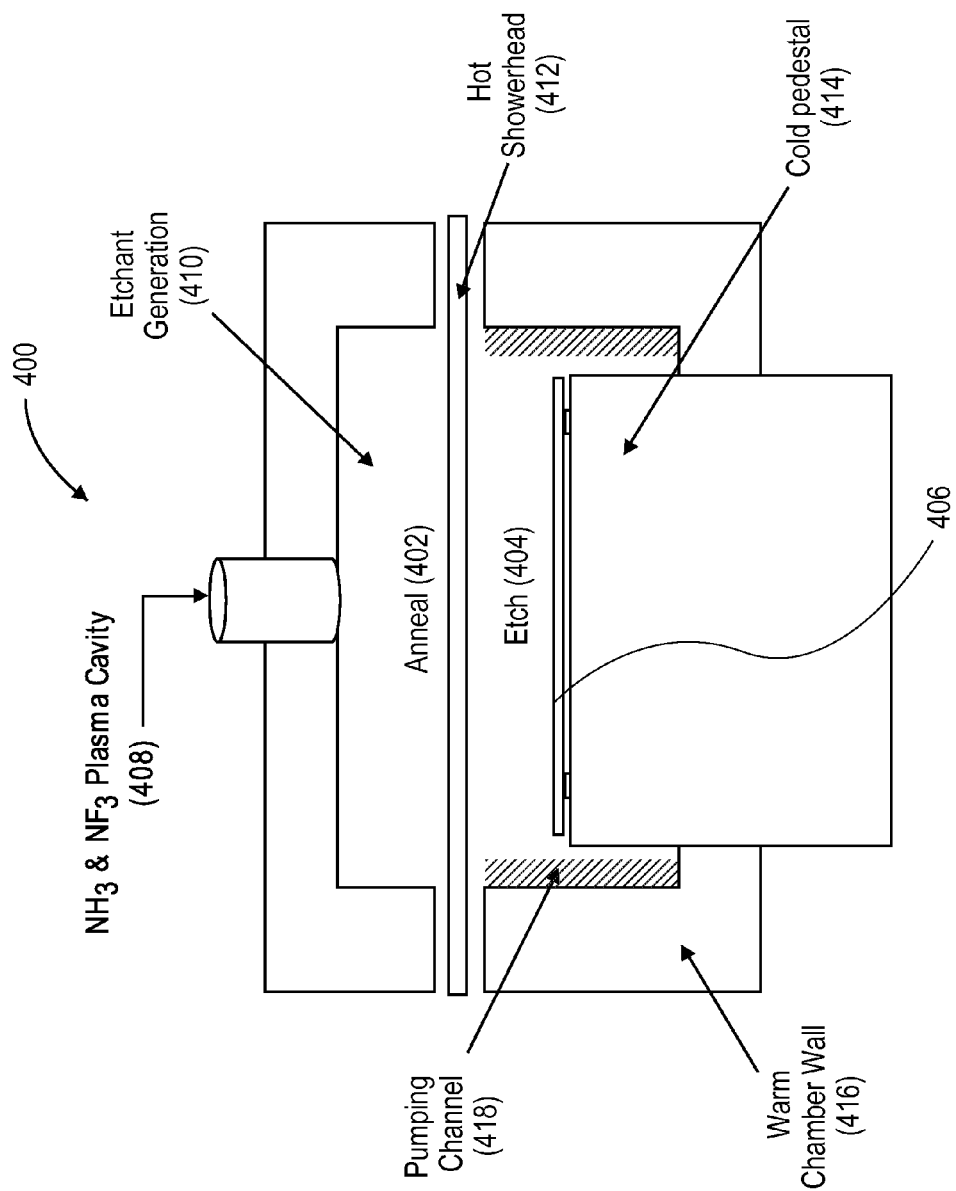
FIG. 4 illustrates a cross-sectional view of a chamber suitable for performing a post etch treatment (PET) of a low-k dielectric film, in accordance with an embodiment of the present invention.

The removal of an Si—O-containing protecting layer such as the protecting layer described above may be performed in a dedicated chamber. FIG. 4 illustrates a cross-sectional view of a chamber suitable for performing a post etch treatment (PET) of a low-k dielectric film, in accordance with an embodiment of the present invention.

Referring to FIG. 4, a siconi preclean chamber 400 includes an anneal region 402 and an etch region 404 for a substrate 406. An $NH_3$ and $NF_3$ plasma cavity 408 is included for remote plasma generation. The plasma cavity 408 is coupled with an etchant generation region 410. In one embodiment, a plasma required for etchant generation is not exposed to the wafer or substrate 406. The preclean chamber 400 also includes a hot showerhead 412 for uniform etchant delivery and to provide a heat source for annealing. A cold pedestal 414 is included for cooling the wafer or substrate 406, for condensing etchant, and for controlling selectivity. A warm chamber wall 416 is included to prevent etchant and by-product condensation. A pumping channel 418 is used for uniform pumping and removal of by-products.

In an embodiment, the siconi preclean chamber 400 is used for etchant generation in a remote plasma cavity and oxide reaction with a wafer or substrate situated on the cold pedestal. The wafer is raised toward the showerhead and sublimation of by-products is effected by the hot showerhead. Upon removal of the by-products, the wafer or substrate is cleaned. The clean wafer or substrate is then lowered for removal. Thus, in one embodiment, a dry clean process, as carried out at least partially in the siconi preclean chamber 400, is used to eliminate post etch residue, to minimize undercut profile and low k damage (effective k), to reduce queue time effect (reduced moisture) and wet chemical impregnation.

As a comparative example, a standard or conventional etch sequence includes via and trench etch plus blok open in an etch reactor. The, wet clean is performed in a wet bench, and a subsequent bake is performed in a furnace. Instead, in one embodiment, a dry clean process includes performing a via and trench etch plus blok open, plus a surface conditioning (SC) in an etch reactor. Then, a sicono clean is performed in a siconi chamber. In a specific such embodiment, silylation is also performed in the siconi chamber. In an embodiment, a single mainframe includes an integrated etch reactor and a siconi chamber to provide a mainframe for an integrated dryclean sequence.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 5:
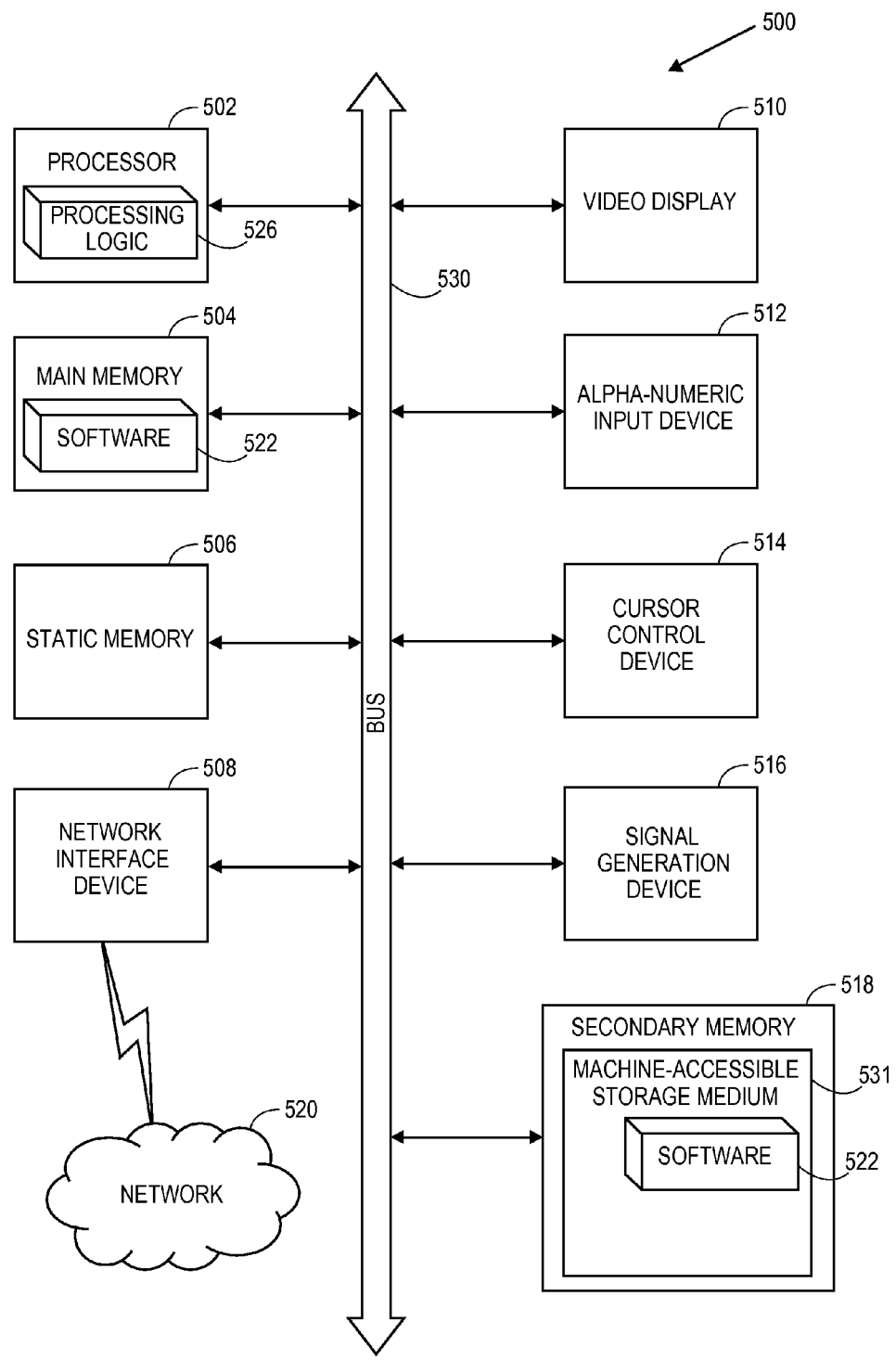
FIG. 5 illustrates a block diagram of an exemplary computer system, in accordance with an embodiment of the present invention.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of patterning a low-k dielectric layer. The method includes etching a low-k dielectric layer disposed above a substrate with a first plasma process. The etching involves forming a fluorocarbon polymer on the low-k dielectric layer. The low-k dielectric layer is surface-conditioned with a second plasma process. The surface-conditioning removes the fluorocarbon polymer and forms an Si—O-containing protecting layer on the low-k dielectric layer. The Si—O-containing protecting layer is removed with a third plasma process.

Patterning of a low-k dielectric layer may be conducted in processing equipment suitable to provide an etch plasma in proximity to a sample for etching. For example, FIG. 6 illustrates a system in which a method, or a portion of a method, of patterning a low-k dielectric film is performed, in accordance with an embodiment of the present invention.

Figure 6:
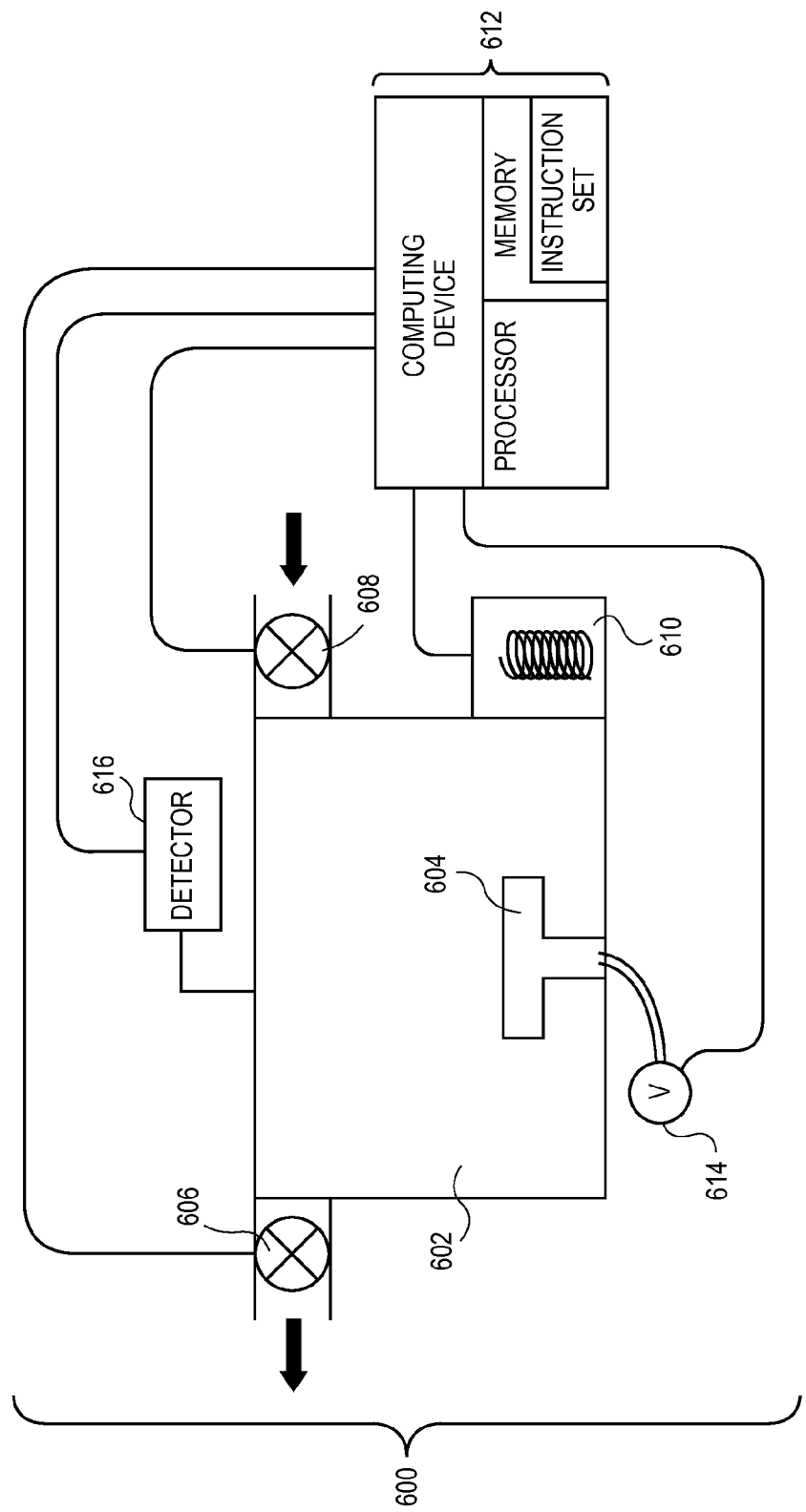
FIG. 6 illustrates a system in which a method of patterning a low-k dielectric film is performed, in accordance with an embodiment of the present invention.

Referring to FIG. 6, a system 600 for conducting a plasma etch process includes a chamber 602 equipped with a sample holder 604. An evacuation device 606, a gas inlet device 608 and a plasma ignition device 610 are coupled with chamber 602. A computing device 612 is coupled with plasma ignition device 610. System 600 may additionally include a voltage source 614 coupled with sample holder 604 and a detector 616 coupled with chamber 602. Computing device 612 may also be coupled with evacuation device 606, gas inlet device 608, voltage source 614 and detector 616, as depicted in FIG. 6.

Chamber 602 and sample holder 604 may include a reaction chamber and sample positioning device suitable to contain an ionized gas, i.e. a plasma, and bring a sample in proximity to the ionized gas or charged species ejected therefrom. Evacuation device 606 may be a device suitable to evacuate and de-pressurize chamber 602. Gas inlet device 608 may be a device suitable to inject a reaction gas into chamber 602. Plasma ignition device 610 may be a device suitable for igniting a plasma derived from the reaction gas injected into chamber 602 by gas inlet device 608. Detection device 616 may be a device suitable to detect an end-point of a processing step. In one embodiment, system 600 includes a chamber 602, a sample holder 604, an evacuation device 606, a gas inlet device 608, a plasma ignition device 610 and a detector 616 similar to, or the same as, those included in an Applied Centura® Enabler dielectric etch system, an Applied Materials™ AdvantEdge G3 system, or an Applied Centura® Enabler Producer Etch system.

In an embodiment, a system for patterning a low-k dielectric film includes a mainframe, an etch chamber housed in the mainframe, and a post etch treatment (PET) chamber housed in the mainframe. In one such embodiment, the etch chamber is for etching a low-k dielectric layer, and the PET chamber is for dry cleaning the low-k dielectric layer. In an exemplary embodiment, a PET chamber such as chamber 400 described above with respect to FIG. 4 and a plasma chamber such as plasma chamber 602 described above in association with FIG. 6 are both included on the same mainframe.

In an embodiment, the etch chamber is further configured for surface-conditioning the low-k dielectric layer, and the PET chamber is configured for removing an Si—O-containing protecting layer from the low-k dielectric layer. In an embodiment, the etch chamber is configured for generating a first plasma from a $C_xF_y$-based gas and for generating a second plasma from an oxygen radical source and a silicon source, and the PET chamber is configured for generating a third plasma from a gas selected from the group based on $NF_3$, ammonia ($NH_3$), or a combination thereof. In an embodiment, the PET chamber is further configured for performing a silylation process on the low-k dielectric layer.

In an embodiment, as mentioned briefly above, one or more of the above processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher, also available from Applied Materials of Sunnyvale, Calif., USA. In another embodiment, one or more of the above processes is performed in an Applied Centura® Producer Etch chamber with a twin chamber design, also available from Applied Materials of Sunnyvale, Calif., USA. For example, the latter may include a high throughput density with the twin chambers and a two-FOUP, dual robot factory interface. Each twin chamber may operate in single- or dual-wafer mode. Etch rate, etch rate uniformity, and resist selectivity can be tuned by adjusting a gap between electrodes, enabling process optimization for different applications.

Thus, post etch treatments (PETs) of low-k dielectric films have been disclosed. In accordance with an embodiment of the present invention, a method of patterning a low-k dielectric film includes etching a low-k dielectric layer disposed above a substrate with a first plasma process. The etching involves forming a fluorocarbon polymer on the low-k dielectric layer. The low-k dielectric layer is surface-conditioned with a second plasma process. The surface-conditioning removes the fluorocarbon polymer and forms an Si—O-containing protecting layer on the low-k dielectric layer. The Si—O-containing protecting layer is removed with a third plasma process. In one embodiment, subsequent to removing the Si—O-containing protecting layer, the low-k dielectric layer is treated with a silylation process.

What is claimed is:

1. A method of patterning a low-k dielectric film, the method comprising:

etching a low-k dielectric layer disposed above a substrate with a first plasma process, the etching comprising forming a fluorocarbon polymer on the low-k dielectric layer;

surface-conditioning, with a second plasma process, the low-k dielectric layer to remove the fluorocarbon polymer and to form an Si—O-containing protecting layer on the low-k dielectric layer, wherein surface-conditioning the low-k dielectric layer with the second plasma process comprises using a plasma derived from an oxygen radical source and a silicon source, and wherein the silicon source is a molecule that reacts with an oxygen radical to form a silicon oxide layer on the low-k dielectric layer, the silicon source selected from the group consisting of silicon tetrafluoride ($SiF_4$), silicon tetrachloride ($SiCl_4$), silane ($SiH_4$) dimethylsilane (($CH_3)_2SiH_2$), trimethylsilane (($CH_3)_3SiH$), and N-(Trimethylsilyl)dimethylamine (($CH_3)_3SiN(CH_2)_2$); and removing the Si—O-containing protecting layer with a third plasma process.

2. The method of claim 1, further comprising:

subsequent to removing the Si—O-containing protecting layer, treating the low-k dielectric layer with a silylation process.

3. The method of claim 2, wherein treating the low-k dielectric layer with the silylation process lowers the effective k-value of the low-k dielectric layer relative to the effective k-value of the low-k dielectric layer following the third plasma process.

4. The method of claim 1, wherein the oxygen radical source is a molecule with a dissociation product comprising an oxygen radical, the oxygen radical source selected from the group consisting of oxygen ($O_2$), ozone ($O_3$), carbon dioxide ($CO_2$), and water ($H_2O$).

5. The method of claim 1, wherein removing the Si—O-containing protecting layer with the third plasma process comprises using a plasma generated from a gas selected from the group consisting of $NF_3$, ammonia ($NH_3$), or a combination thereof.

6. The method of claim 1, wherein etching the low-k dielectric layer with the first plasma process comprises using a plasma generated from a $C_xF_y$-based gas.

7. A method of patterning a low-k dielectric film, the method comprising:

etching a trench in a low-k dielectric layer with a first plasma process, the low-k dielectric layer disposed above a substrate, and the etching comprising forming a fluorocarbon polymer on the low-k dielectric layer in the trench;

surface-conditioning, with a second plasma process, the low-k dielectric layer to remove the fluorocarbon polymer from the trench and to form an Si—O-containing protecting layer on the low-k dielectric layer in the trench;

removing the Si—O-containing protecting layer with a third plasma process; and without exposing the low-k dielectric layer to a wet clean process, forming a metal layer in the trench.

8. The method of claim 7, further comprising:

subsequent to removing the Si—O-containing protecting layer and prior to forming the metal layer, and without exposing the low-k dielectric layer to a pre-bake process, treating the low-k dielectric layer with a silylation process.

9. The method of claim 8, wherein treating the low-k dielectric layer with the silylation process lowers the effective k-value of the low-k dielectric layer relative to the effective k-value of the low-k dielectric layer following the third plasma process.

10. The method of claim 7, wherein surface-conditioning the low-k dielectric layer with the second plasma process comprises using a plasma derived from an oxygen radical source and a silicon source.

11. The method of claim 10, wherein the oxygen radical source is a molecule with a dissociation product comprising an oxygen radical, the oxygen radical source selected from the group consisting of oxygen ($O_2$), ozone ($O_3$), carbon dioxide ($CO_2$), and water ($H_2O$).

12. The method of claim 10, wherein the silicon source is a molecule that reacts with an oxygen radical to form a silicon oxide layer on the low-k dielectric layer, the silicon source selected from the group consisting of silicon tetrafluoride ($SiF_4$), silicon tetrachloride ($SiCl_4$), silane ($SiH_4$), dimethylsilane (($CH_3)_2SiH_2$), trimethylsilane (($CH_3)_3SiH$), and N-(Trimethylsilyl)dimethylamine (($CH_3)_3SiN(CH_2)_2$).

13. The method of claim 7, wherein removing the Si—O-containing protecting layer with the third plasma process comprises using a plasma generated from a gas selected from the group consisting of $NF_3$, ammonia ($NH_3$), or a combination thereof.

* * * * *